(12) United States Patent
Kamata

(10) Patent No.: US 11,894,789 B2
(45) Date of Patent: Feb. 6, 2024

(54) POWER CONVERSION DEVICE AND ELECTRIC DRIVE UNIT

(71) Applicant: Hitachi Astemo, Ltd., Hitachinaka (JP)

(72) Inventor: Seiji Kamata, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 24 days.

(21) Appl. No.: 17/612,112

(22) PCT Filed: May 15, 2020

(86) PCT No.: PCT/JP2020/019507
§ 371 (c)(1),
(2) Date: Nov. 17, 2021

(87) PCT Pub. No.: WO2020/235500
PCT Pub. Date: Nov. 26, 2020

(65) Prior Publication Data
US 2022/0255484 A1    Aug. 11, 2022

(30) Foreign Application Priority Data

May 21, 2019    (JP) .................................. 2019-094956

(51) Int. Cl.
*H02P 27/06*    (2006.01)
*H02K 11/33*    (2016.01)

(52) U.S. Cl.
CPC .............. *H02P 27/06* (2013.01); *H02K 11/33* (2016.01)

(58) Field of Classification Search
CPC .......... H02P 29/00; H02P 29/60; H02P 29/62; H02P 29/64; H02P 29/66; H02P 29/68; H02P 2201/07; H02P 2201/09; H02P 2201/11; H02P 2207/05; H02P 27/00; H02P 27/04; H02P 27/06; H02P 27/08; H02P 25/092; H02P 25/062; H02P 25/064; H02P 7/292; H02P 6/32; H02P 1/00; H02P 1/24; H02P 1/26; H02P 1/42; H02P 1/46; H02P 1/16; H02P 2209/01; H02K 11/33; H02M 7/003; H02M 3/003; H02M 7/4835; H02M 7/483; H02M 7/537; H01M 2220/20; H01M 2010/4271; H01M 10/425; H01M 10/625; H01M 10/613; H01M 10/615; H01M 10/443; H01M 10/486; H01M 10/441;
(Continued)

(56) References Cited

FOREIGN PATENT DOCUMENTS

| JP | 2005135601 A | 5/2003 |
|----|--------------|--------|
| JP | 2014076781 A | 5/2014 |
| JP | 2016021817 A | 2/2016 |

(Continued)

OTHER PUBLICATIONS

International Search Report for International Application No. PCT/JP2020/019507; dated Jun. 16, 2020.
(Continued)

*Primary Examiner* — Antony M Paul
(74) *Attorney, Agent, or Firm* — CANTOR COLBURN LLP

(57) ABSTRACT

Provided is a power conversion device including an all-solid-state battery, a power converter that converts power between the all-solid-state battery and a load, and a thermal coupling member that thermally couples the all-solid-state battery and the power converter.

6 Claims, 5 Drawing Sheets

(58) Field of Classification Search
CPC .......... H01M 4/382; H01M 2300/0065; B60R 16/03; B60R 16/033; H10N 10/17
See application file for complete search history.

(56) References Cited

FOREIGN PATENT DOCUMENTS

| | | | | |
|---|---|---|---|---|
| JP | 2019022300 A | | 2/2019 | |
| KR | 20160067565 A | * | 6/2016 | ............ H01M 10/66 |
| KR | 101824695 B1 | | 2/2018 | |
| WO | 2018061814 A1 | | 4/2018 | |
| WO | 2018092751 A1 | | 5/2018 | |

OTHER PUBLICATIONS

JPO Notice of Reasons for Refusal for corresponding JP Application No. 2021-520772; dated May 31, 2022.

* cited by examiner

POWER CONVERSION DEVICE AND ELECTRIC DRIVE UNIT

CROSS REFERENCE TO RELATED APPLICATIONS

This is the U.S. national stage of application No. PCT/JP2020/019507, filed on May 15, 2020. Priority under 35 U.S.C. § 119(a) and 35 U.S.C. § 365(b) is claimed from Japanese Application No. 2019-094956, filed May 21, 2019, the disclosure of which is also incorporated herein by reference.

TECHNICAL FIELD

Background Art

Patent Literature 1 discloses a power conversion device including a battery module mounted in an electric automobile and a power converter that steps up power which is output from the battery module and converts the stepped up power into alternating-current power. Both the battery module and the power converter generate a large amount of heat. The operating temperatures of the battery module and the power converter are required to be maintained at a rated upper limit or less.

CITATION LIST

Patent Literature

[Patent Literature 1]
Japanese Unexamined Patent Application, First Publication No. 2014-76781

SUMMARY OF INVENTION

Technical Problem

In the above battery module, a lithium-ion battery is often used, and the rated upper limit of its operating temperature is generally low. The above power converter includes a semiconductor element for high power. In the above power converter, more heat due to power loss is generated than in the battery module, and the rated upper limit of its operating temperature is higher than that of a lithium-ion battery. In the related art, in order to control the operating temperatures of the battery module and the power converter to a rated upper limit or less, the battery module and the power converter are structurally separated from each other so as not to thermally interfere with each other. The battery module and the power converter are each cooled by different cooling devices. As a result, the size of the power conversion device has increased.

The present invention was contrived in view of such circumstances, and an object thereof is to suppress an increase in the size of the power conversion device.

Solution to Problem (1) According to an aspect of the present invention, there is provided a power conversion device including: an all-solid-state battery; a power converter that converts power between the all-solid-state battery and a load; and a thermal coupling member that thermally couples the all-solid-state battery and the power converter.

(2) The power conversion device of the above (1) may further include a first circuit substrate having a first surface and a second surface opposite to the first surface, the all-solid-state battery and the power converter may be mounted on the first surface, and the thermal coupling member may be disposed on the second surface.

(3) In the power conversion device of the above (2), the power converter may include an inverter and a step-up converter, and the inverter, the step-up converter, and the all-solid-state battery may be mounted in that order from a first end side of the first surface toward its second end side.

(4) In the power conversion device of the above (3), a switching element included in the inverter and the step-up converter may be a switching element formed of a wide-gap semiconductor.

(5) The power conversion device of any one of the above (2) to (4) may further include: a first control device that monitors a state of the all-solid-state battery; a second control device that controls the power converter; and a second circuit substrate having a third surface facing the first surface and a fourth surface opposite to the third surface, the first control device may be mounted on at least any of the third surface and the fourth surface so as to be located above the all-solid-state battery, and the second control device may be mounted on at least any of the third surface and the fourth surface so as to be located above the power converter.

(6) There is provided an electric drive unit including: the power conversion device according to any one of the above (2) to (5); and a motor serving as the load, wherein the motor is thermally coupled to the all-solid-state battery and the power converter by being in contact with the thermal coupling member.

Advantageous Effects of Invention

As described above, according to the present invention, it is possible to suppress an increase in the size of the power conversion device.

DESCRIPTION OF EMBODIMENTS

Hereinafter, a power conversion device according to the present embodiment will be described with reference to the accompanying drawings.

First Embodiment

Figure 1:
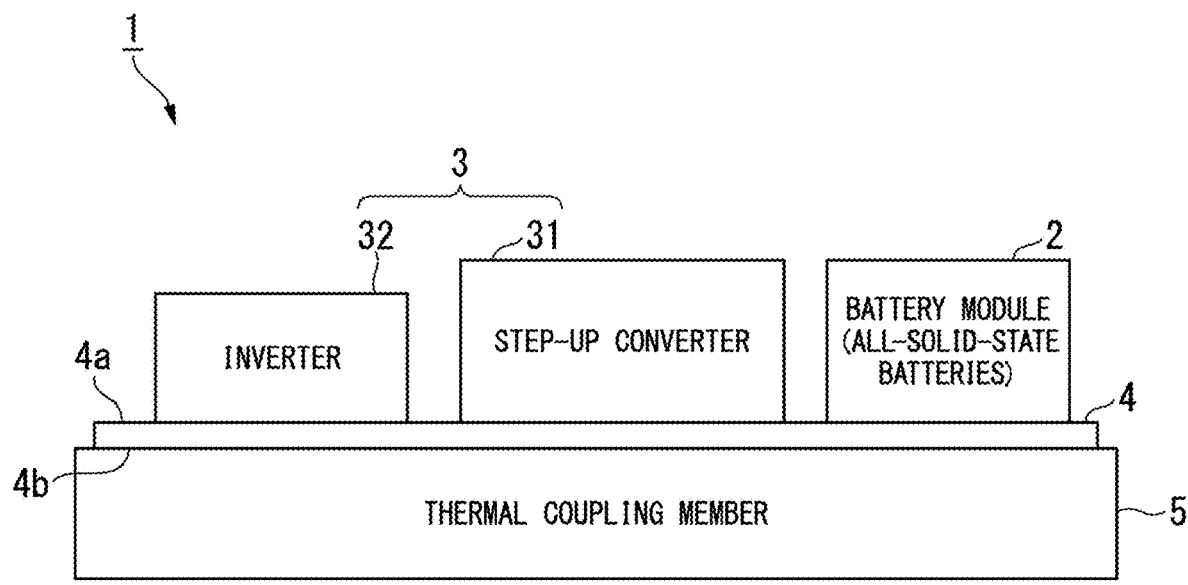
FIG. 1 is a diagram illustrating an example of a side view of a power conversion device 1 according to a first embodiment.
Figure 2:
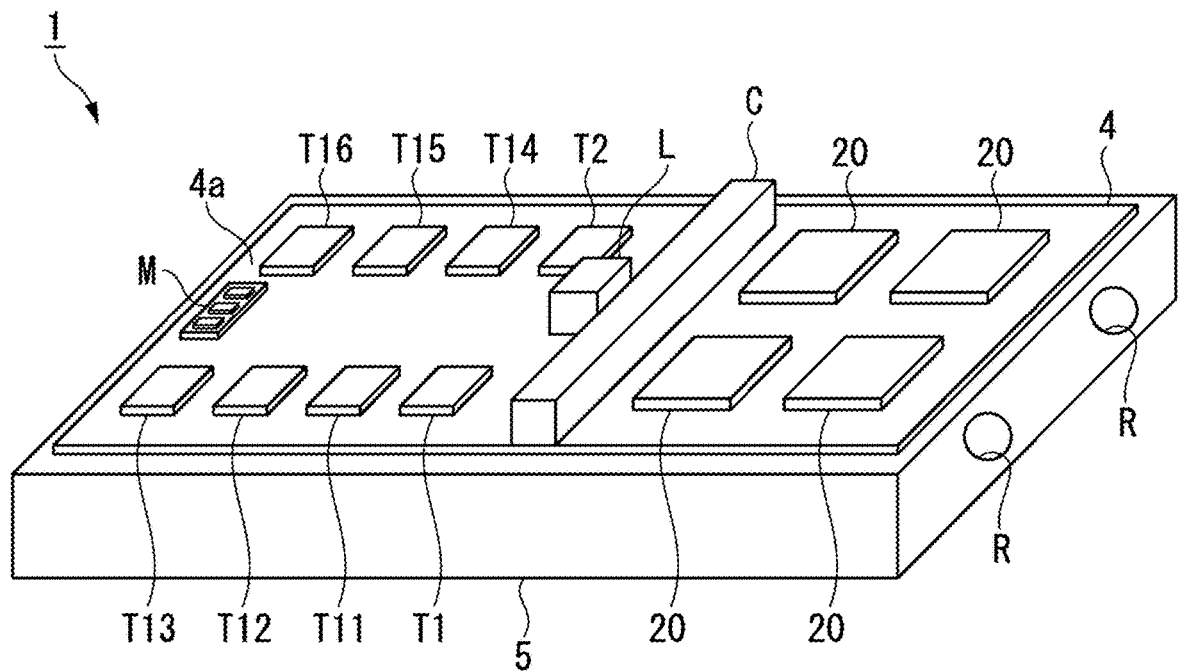
FIG. 2 is a diagram illustrating an example of a specific configuration of the power conversion device 1 according to the first embodiment.

FIG. 1 is a diagram illustrating an example of a side view of a power conversion device 1 according to a first embodiment. FIG. 2 is a diagram illustrating an example of a specific configuration of the power conversion device 1 according to the first embodiment. The power conversion device 1 is mounted in a vehicle. The vehicle is, for example, a hybrid automobile or an electric automobile.

As shown in FIG. 1, the power conversion device 1 includes a battery module 2, a power converter 3, a circuit substrate 4, and a thermal coupling member 5. The circuit substrate 4 is equivalent to a "first circuit substrate" of the present invention.

The battery module 2 includes a plurality of all-solid-state batteries 20. The all-solid-state batteries 20 are batteries using a solid electrolyte that does not contain an organic electrolyte solution. The all-solid-state batteries 20 have a higher heat resistance temperature than a lithium-ion battery. The heat resistance temperature is the rated upper limit of operating temperature. For example, the heat resistance temperature of the all-solid-state batteries 20 is approximately 150° C., whereas the heat resistance temperature of a lithium-ion battery is approximately 60° C. The plurality of all-solid-state batteries 20 are mounted on the circuit substrate 4.

The battery module 2 includes the plurality of all-solid-state batteries 20 in the present embodiment, but it is not limited thereto and need only include one or more all-solid-state batteries 20. The power conversion device 1 need only include one or more all-solid-state batteries 20, and there is no particular limitation to the number of all-solid-state batteries 20.

The power converter 3 converts power between the battery module 2 and a load. The load is, for example, a motor for traveling of the above vehicle. The power converter 3 is mounted on the circuit substrate 4.

The power converter 3 includes a step-up converter 31 and an inverter 32.

The step-up converter 31 steps up power which is output from the plurality of all-solid-state batteries 20 at a predetermined step-up ratio and outputs the power to the inverter 32. In the present embodiment, the step-up converter 31 may further have a function of stepping down regenerative power which is input from the inverter 32 at a predetermined step-down ratio and outputting the regenerative power to the plurality of all-solid-state batteries 20.

The step-up converter 31 includes a smoothing capacitor C, a reactor L, and switching elements T1 and T2 which are connected in series to each other. The smoothing capacitor C smooths a voltage which is output from the battery module 2.

The reactor L is configured with one end thereof connected to an output terminal of the battery module 2 (a positive electrode terminal of the all-solid-state batteries 20) and the other end thereof connected to a connection point between the switching element T1 and the switching element T2.

The switching elements T1 and T2 are semiconductor elements. A case where the switching elements T1 and T2 of the present embodiment are insulated gate bipolar transistors (IGBTs) will be described, but the present invention is not limited thereto and the switching elements may be, for example, field effective transistors (FETs) or the like. Switching elements T1 and T12 may be switching elements formed of a wide-gap semiconductor such as silicon carbide (SiC) or gallium nitride (GaN).

The step-up converter 31 steps up power which is output from the battery module 2 by turning ON/OFF the switching elements T1 and T2 and alternately repeating the storage and release of magnetic energy of the reactor L. The step-up converter 31 supplies the stepped up power to the inverter 32. The step-up converter 31 may include a capacitor for smoothing that smooths a stepped up voltage.

The inverter 32 converts the power which is output from the step-up converter 31 into alternating-current power and supplies the converted power to a load such as a motor. In the present embodiment, the inverter 32 is a three-phase inverter and includes three switching legs corresponding to each phase.

The inverter 32 includes switching elements T11 to T16 which are semiconductor elements. The switching elements T11 to T16 may be IGBTs, or may be FETs. Among the switching elements T11 to T16 provided in the inverter 32, the switching elements T11 and T14 are connected in series to form a pair, the switching elements T12 and T15 are connected in series to form a pair, and the switching elements T13 and T16 are connected in series to form a pair. The windings of three phases (U-phase, V-phase, and W-phase) of the motor are connected to each of connection points of the paired switching elements T11 to T16 through a terminal M.

The switching elements T11 to T16 may be switching elements formed of a wide-gap semiconductor such as SiC or GaN.

The circuit substrate 4 has a first surface 4a and a second surface 4b opposite to the first surface 4a. The battery module 2 and the power converter 3 are mounted on the first surface 4a of the circuit substrate 4. In this way, the battery module 2 and the power converter 3 are mounted on the same surface of the circuit substrate 4.

Specifically, on the first surface 4a of the circuit substrate 4, the inverter 32, the step-up converter 31, and the battery module 2 are mounted in that order from its first end side toward its second end side.

The thermal coupling member 5 is disposed on the second surface 4b of the circuit substrate 4.

The thermal coupling member 5 thermally couples the battery module 2 (the plurality of all-solid-state batteries 20) and the power converter 3. The term "thermal coupling" refers to a state of being thermally coupled. The thermal coupling of the present embodiment is a state in which heat is transferred between the battery module 2 and the power converter 3 through the thermal coupling member 5. The thermal coupling member 5 is a material having high thermal conductivity and is a metal such as, for example, aluminum, iron, or copper. For example, the thermal coupling member 5 is a heat sink. The heat sink is an approximately rectangular parallelepiped member constituted by a metal such as aluminum. The heat sink may have one or more refrigerant flow channels R through which a refrigerant circulates. Thereby, the operating temperatures of the battery module 2 and the power converter 3 are controlled to a rated upper limit or less due to a refrigerant flowing through the refrigerant flow channel R.

Since the thermal coupling member 5 according to the present embodiment is a heat sink, the thermal coupling member has a first function of thermally coupling the battery module 2 (the plurality of all-solid-state batteries 20) and the power converter 3 and a second function of cooling heat generated by the battery module 2 and the power converter 3.

For example, the refrigerant flows in a direction from the first end side of the circuit substrate 4 toward the second end side thereof. The refrigerant flows from the power converter 3 toward the battery module 2 in the refrigerant flow channel R.

The power conversion device 1 according to first embodiment includes the battery module 2 having the all-solid-state batteries 20, the power converter 3, and the thermal coupling member 5 that thermally couples the battery module 2 and the power converter 3.

The power conversion device 1 of the first embodiment is configured to thermally couple the all-solid-state batteries 20 and the power converter 3 using the thermal coupling member 5. Therefore, the operating temperatures of the battery module 2 and the power converter 3 can be controlled to a rated upper limit or less by one cooling device. As a result, the size of the power conversion device decreases.

Specifically, in a power conversion device of the related art, heat generated by a battery module is cooled by an electric fan, and a power converter is cooled by a water cooling system. Therefore, in the power conversion device of the related art, two cooling devices, that is, an electric fan and a water cooling system, are required to cool the battery module and the power converter.

In the power conversion device 1 according to the first embodiment, the battery module 2 is constituted by the all-solid-state batteries 20, and the all-solid-state batteries 20 and the power converter 3 are thermally coupled to each other using the thermal coupling member 5 such as a heat sink. Thereby, for example, the temperatures of the all-solid-state batteries 20 and the power converter 3 can be controlled by one cooling device.

The battery capacity of the all-solid-state batteries 20 increases at a high temperature, and the lifespan characteristics thereof at a high temperature are also improved more considerably than a lithium-ion battery. The power conversion device 1 according to the first embodiment thermally couples the all-solid-state batteries 20 and the power converter 3 using the thermal coupling member 5 such as a heat sink. The power conversion device 1 transfers heat of the power converter 3 to the all-solid-state batteries 20 and efficiently warms up the all-solid-state batteries 20. Thereby, the power conversion device 1 according to the first embodiment can maximize the performance of the all-solid-state batteries 20.

The power conversion device 1 according to the first embodiment is configured with the all-solid-state batteries 20 and the power converter 3 mounted on the first surface 4a of the circuit substrate 4. For example, on the first surface 4a of the circuit substrate 4, the inverter 32, the step-up converter 31, and the all-solid-state batteries 20 are mounted in that order from its first end side toward its second end side. Thereby, the power conversion device 1 can shorten a wiring distance between each component more than in the related art, which contributes to the reduction of the number of smoothing capacitors, noise reduction, and a reduction in the size of the device.

Second Embodiment

Figure 3:
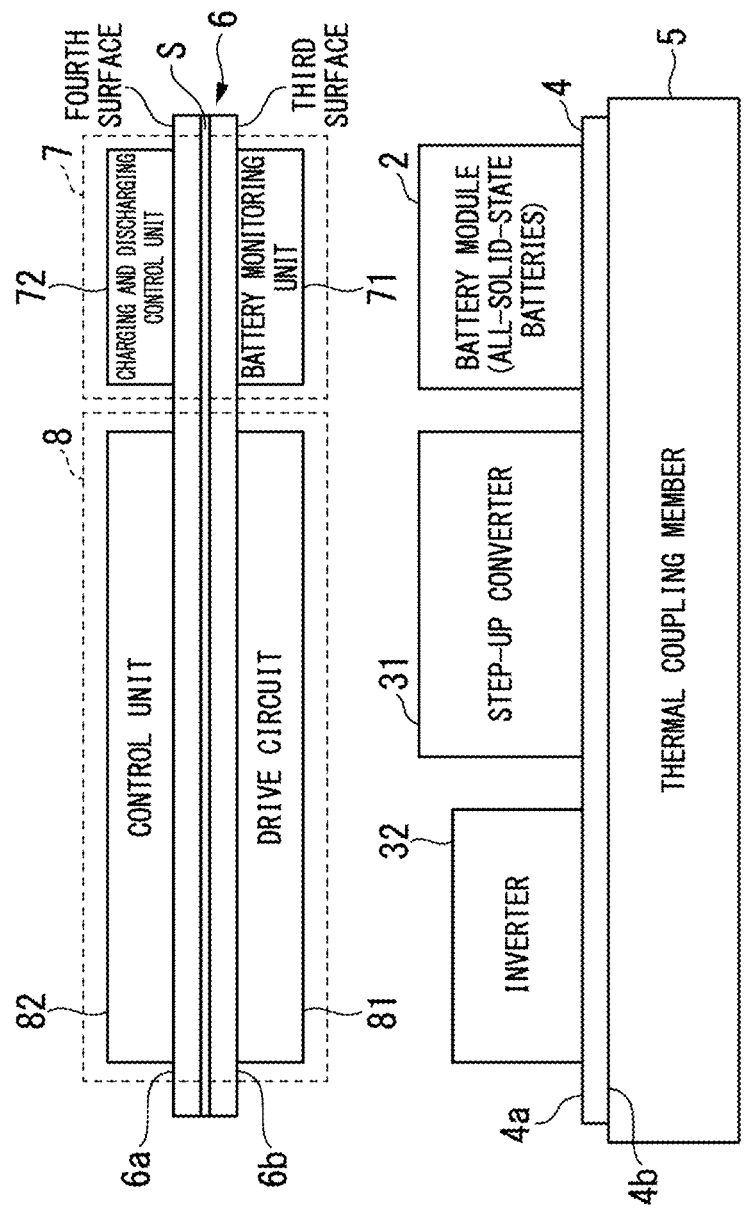
FIG. 3 is a side view of a power conversion device 1B according to a second embodiment.

A power conversion device 1B according to a second embodiment will be described below. FIG. 3 is a side view of the power conversion device 1B according to the second embodiment.

The power conversion device 1B according to the second embodiment is different from the power conversion device 1 of the first embodiment in that it includes a first control device 7 and a second control device 8. The first control device 7 monitors and controls the state of the battery module 2. The second control device 8 controls the power converter 3. In the drawings, the same or similar portions are denoted by the same reference numerals and signs, and thus description thereof will not be repeated.

Specifically, the power conversion device 1B includes the battery module 2, the power converter 3, the circuit substrate 4, the thermal coupling member 5, a circuit substrate for control 6, the first control device 7, and the second control device 8. The circuit substrate for control 6 is equivalent to a "second circuit substrate" of the present invention.

The circuit substrate for control 6 has a third surface 6b facing the first surface 4a of the circuit substrate 4 and a fourth surface 6a opposite to the third surface 6b. The third surface 6b and the fourth surface 6a are surfaces on which component mounting and wiring are performed. In addition, a shield layer S is interposed between the third surface 6b and the fourth surface 6a.

The first control device 7 monitors and controls the state of the battery module 2. Specifically, the first control device 7 includes a battery monitoring unit 71 and a charging and discharging control unit 72.

The battery monitoring unit 71 monitors the state (for example, output voltage) of the plurality of all-solid-state batteries 20 constituting the battery module 2. The battery monitoring unit 71 includes a plurality of integrated circuits (ICs). The battery monitoring unit 71 is mounted on the third surface 6b of the circuit substrate for control 6. The battery monitoring unit 71 is mounted on the third surface 6b so as to be located above the battery module 2.

The charging and discharging control unit 72 controls charging and discharging of the plurality of all-solid-state batteries 20 constituting the battery module 2. For example, the charging and discharging control unit 72 is a battery electronic control unit (ECU). The charging and discharging control unit 72 is mounted on the fourth surface 6a of the circuit substrate for control 6. The charging and discharging control unit 72 is mounted on the fourth surface 6a so as to be located above the battery module 2.

However, the present invention is not limited thereto, and the battery monitoring unit 71 and the charging and discharging control unit 72 need only be mounted on at least any of the third surface 6b and the fourth surface 6a.

The second control device 8 includes a drive circuit 81 and a control unit 82.

The drive circuit 81 includes a gate driver that drives the switching elements T11 to T16. The drive circuit 81 includes a gate driver that drives the switching elements T1 and 2. The drive circuit 81 is mounted on the third surface 6b of the circuit substrate for control 6. The drive circuit 81 is mounted on the third surface 6b so as to be located above the power converter 3.

The control unit 82 controls drive of the drive circuit 81 to perform switching control on the switching elements T11 to T16 and the switching elements T1 and 2. The control unit 82 is, for example, a so-called motor ECU having a microcomputer. The control unit 82 is mounted on the fourth surface 6a of the circuit substrate for control 6. The control unit 82 is mounted on the fourth surface 6a so as to be located above the power converter 3.

The drive circuit 81 and the control unit 82 need only be mounted on at least any of the third surface 6b and the fourth surface 6a.

In this way, similarly to the first embodiment, the power conversion device 1B according to the second embodiment includes the battery module 2 having the all-solid-state batteries 20, the power converter 3, and the thermal coupling member 5 that thermally couples the battery module 2 and the power converter 3.

According to such a configuration, since the power conversion device 1B of the second embodiment thermally couples the all-solid-state batteries 20 and the power converter 3 using the thermal coupling member 5, the operating temperatures of the battery module 2 and the power converter 3 can be controlled to a rated upper limit or less by one cooling device. As a result, the size of the power conversion device decreases. Further, the power conversion device 1B according to the second embodiment thermally couples the all-solid-state batteries 20 and the power converter 3 using the thermal coupling member 5 such as a heat sink. The power conversion device 1B transfers heat of the power converter 3 to the all-solid-state batteries 20 and efficiently warms up the all-solid-state batteries 20. Thereby, the power conversion device 1B according to the second embodiment can maximize the performance of the all-solid-state batteries 20.

The power conversion device 1B according to the second embodiment is configured with the all-solid-state batteries 20 and the power converter 3 mounted on the first surface 4a of the circuit substrate 4. For example, on the first surface 4a of the circuit substrate 4, the inverter 32, the step-up converter 31, and the all-solid-state batteries 20 are mounted in that order from its first end side toward its second end side. The first control device 7 is mounted on at least any of the third surface 6b and the fourth surface 6a to be located above the all-solid-state batteries 20. The second control device 8 is mounted on at least any of the third surface 6b and the fourth surface 6a so as to be located above the power converter 3. Thereby, the power conversion device 1B can shorten a wiring distance between each component more than in the related art, which contributes to the reduction of the number of smoothing capacitors, noise reduction, and a reduction in the size of the device.

Third Embodiment

Figure 4:
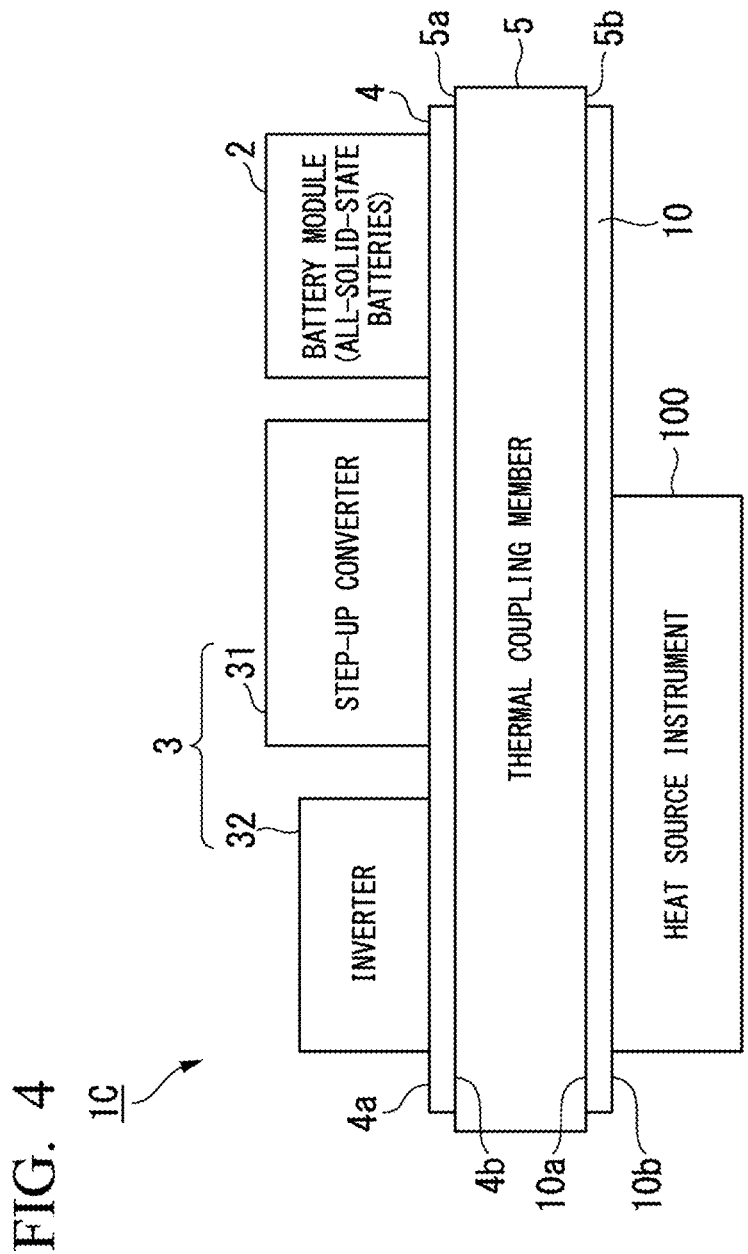
FIG. 4 is a side view of a power conversion device 1C according to a third embodiment.

A power conversion device 1C according to a third embodiment will be described below. FIG. 4 is a side view of the power conversion device 1C according to the third embodiment.

The power conversion device 1C according to the third embodiment is different from the power conversion device 1 of the first embodiment in that it includes a heat source instrument 100. In the drawings, the same or similar portions are denoted by the same reference numerals and signs, and thus description thereof will not be repeated.

Specifically, the power conversion device 1C includes the battery module 2, the power converter 3, the circuit substrate 4, the thermal coupling member 5, a circuit substrate 10, and the heat source instrument 100.

In the thermal coupling member 5, a first surface 5a is in contact with the second surface 4b of the circuit substrate 4, and a second surface 5b is in contact with the circuit substrate 10.

The circuit substrate 10 has a first surface 10a and a second surface 10b opposite to the first surface 10a. The second surface 5b of the thermal coupling member 5 is in contact with the first surface 10a of the circuit substrate 10. The heat source instrument 100 is mounted on the second surface 10b of the circuit substrate 10.

The heat source instrument 100 is a heat source instrument other than the power converter 3 and the battery module 2, and is, for example, a charging instrument that charges a DCDC converter (for example, a step-down converter) or the battery module 2.

As described above, the power conversion device 1C according to the third embodiment includes the battery module 2 having the all-solid-state batteries 20, the power converter 3, and the thermal coupling member 5 that thermally couples the battery module 2 and the power converter 3.

According to such a configuration, the power conversion device 1C according to the third embodiment can exhibit the same effect as that of the first embodiment.

In addition, the power conversion device 1C according to the third embodiment further includes the heat source instrument 100, and thermally couples the battery module 2, the power converter 3, and the heat source instrument 100 through the thermal coupling member 5.

According to such a configuration, the power conversion device 1C can cool the battery module 2, the power converter 3, and the heat source instrument 100 with one cooling device without needing to cool them with different cooling devices, which contributes to a reduction in the size of the device.

Figure 5:
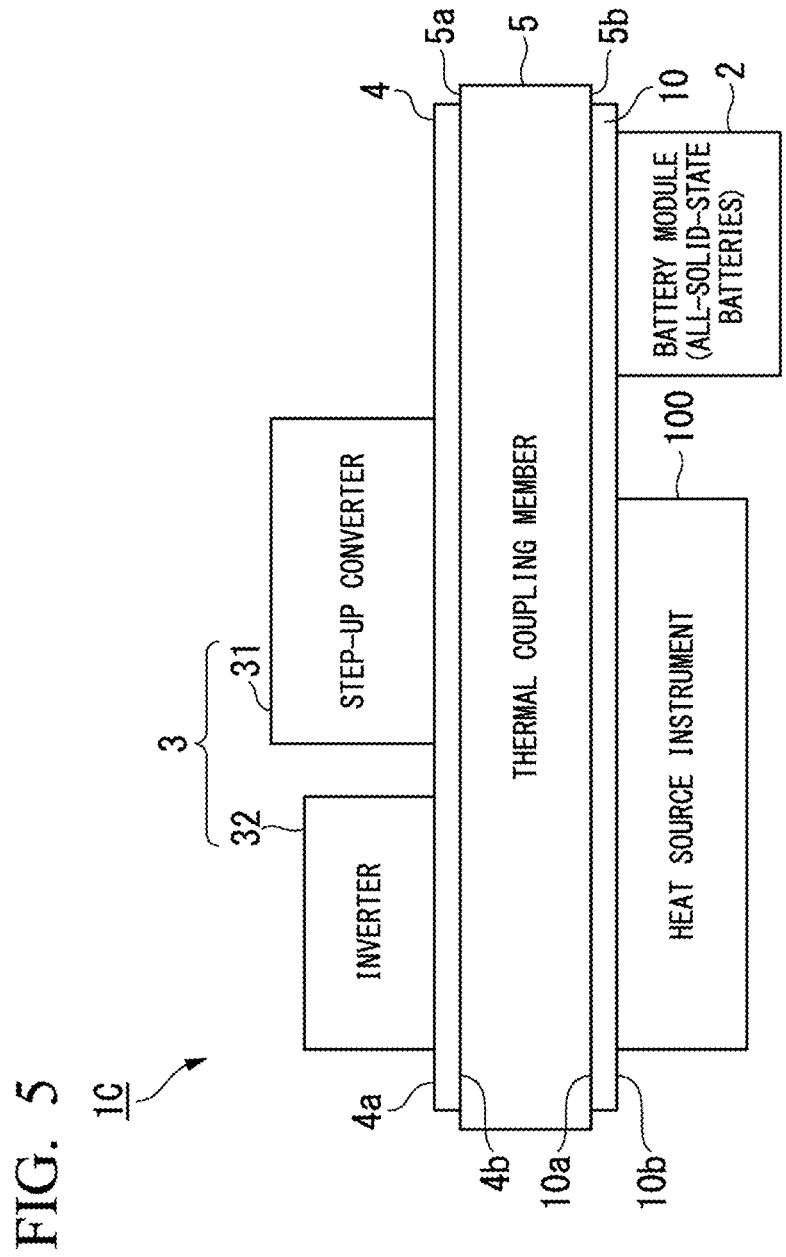
FIG. 5 is a diagram illustrating a modification example of the power conversion device 1C according to the third embodiment of the present embodiment.

In the power conversion device 1C, the battery module 2 and the power converter 3 do not necessarily have to be mounted on the same surface. For example, as shown in FIG. 5, the battery module 2 may be mounted on the second surface 10b of the circuit substrate 10.

Fourth Embodiment

Figure 6:
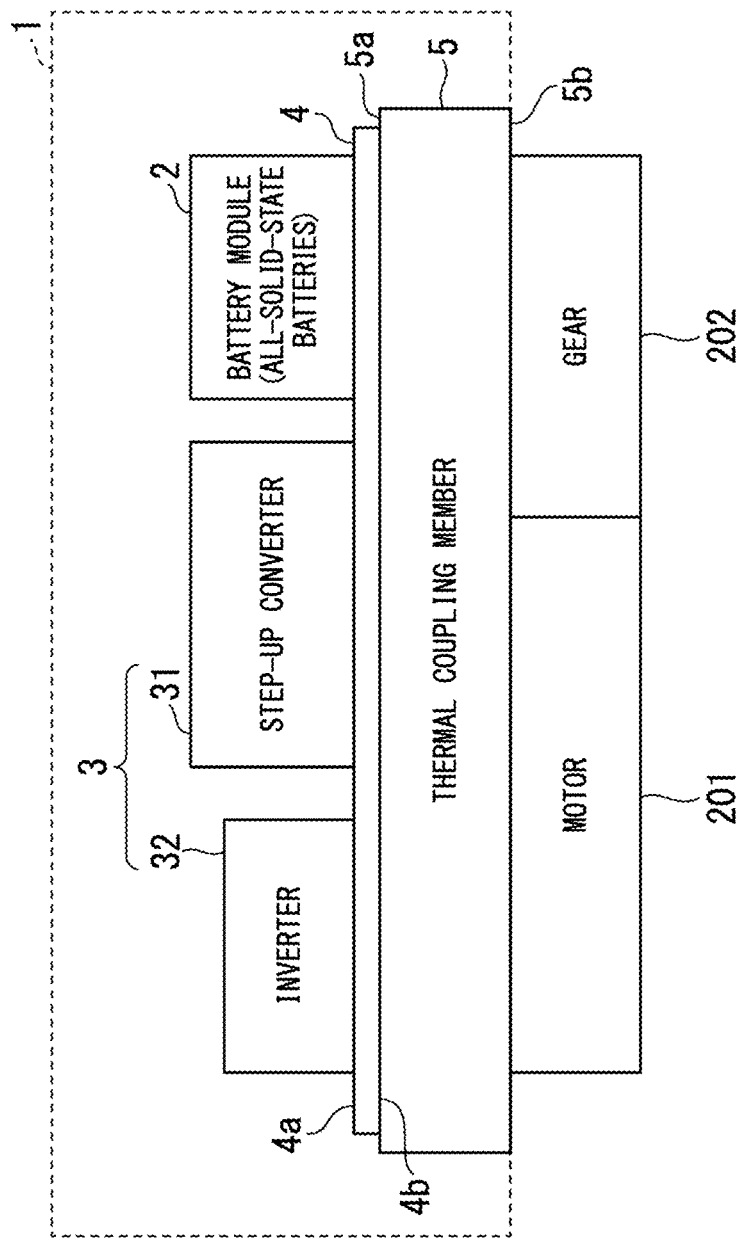
FIG. 6 is a side view of an electric drive unit 200 according to a fourth embodiment.

Next, an electric drive unit 200 according to a fourth embodiment will be described. FIG. 6 is a schematic configuration diagram of the electric drive unit 200. In the drawings, the same or similar portions are denoted by the same reference numerals and signs, and thus description thereof will not be repeated.

The electric drive unit 200 drives wheels of a vehicle with power of the battery module 2. The electric drive unit 200 includes the power conversion device 1, a motor 201, and a gear 202 integrally.

The power conversion device 1 steps up power of the battery module 2 with the power converter 3 and converts the stepped up power into alternating-current power to supply the converted power to the motor 201.

The motor 201 is a motor for traveling that rotates with power which is supplied from the power conversion device 1. The motor 201 is provided on the second surface 5b of the thermal coupling member 5.

The gear 202 drives the wheels of the above vehicle by transferring the rotational force of the motor 201 to the wheels. The gear 202 is provided on the second surface 5b of the thermal coupling member 5.

The thermal coupling member 5 according to the fourth embodiment thermally couples the battery module 2 having the all-solid-state batteries 20, the power converter 3, and the motor 201. According to such a configuration, in the fourth embodiment, the operating temperatures of the battery module 2, the power converter 3, and the motor 201 can be controlled to a rated upper limit or less by one cooling device. As a result, the size of the electric drive unit 200 having the power conversion device decreases. The electric drive unit 200 can efficiently transfer heat generated in the motor 201 to the all-solid-state batteries 20 and can maximize the performance of the all-solid-state batteries 20.

In the electric drive unit 200 according to the fourth embodiment, the all-solid-state batteries 20 and the power converter 3 are provided on the first surface 5a side of the thermal coupling member 5, and the motor 201 is provided on the second surface 5b side of the thermal coupling member 5. This makes it possible to shorten a wiring distance between the motor 201 and the power conversion device 1, which contributes to the reduction of the number of smoothing capacitors, noise reduction, and a reduction in the size of the device.

Hereinbefore, the embodiments of the present invention have been described in detail with the accompanying drawings, but specific configurations are not limited to these embodiments, and may also include a design and the like without departing from the scope of the present invention.

(Modification example 1) The power conversion device 1 of the first embodiment, the power conversion device 1B of the second embodiment, and the electric drive unit 200 of the fourth embodiment may include the heat source instrument 100 according to the third embodiment. For example, in the power conversion device 1 according to the first embodiment, the circuit substrate 10 may be provided on the second surface 5b of the thermal coupling member 5, and the heat source instrument 100 may be mounted on the circuit substrate 10. For example, in the power conversion device 1B according to the second embodiment, the circuit substrate 10 may be provided on the second surface 5b of the thermal coupling member 5, and the heat source instrument 100 may be mounted on the circuit substrate 10. In the electric drive unit 200, the circuit substrate 10 may be provided on the second surface 5b of the thermal coupling member 5, and the heat source instrument 100 may be mounted on the circuit substrate 10.

(Modification example 2) The power conversion device 1 of the first embodiment, the power conversion device 1C of the third embodiment, and the electric drive unit 200 of the fourth embodiment may include the circuit substrate for control 6, the first control device 7, and the second control device 8 which are described in the second embodiment.

(Modification example 3) In the first to fourth embodiments, the thermal coupling member 5 may not include the refrigerant flow channel R. The thermal coupling member 5 is only required to be a member that thermally couples the all-solid-state batteries 20 and the power converter 3 and may not have a cooling capacity.

(Modification example 4) In the power conversion device 1 of the first embodiment, the power conversion device 1B of the second embodiment, and the electric drive unit 200 of the fourth embodiment, the power converter 3 may be provided on the first surface 5a side of the thermal coupling member 5, and the battery module 2 may be provide on the second surface 5b side of the thermal coupling member 5. The power conversion device 1, the power conversion device 1B, and the electric drive unit 200 may have a structure in which the thermal coupling member 5 is interposed between the battery module 2 and the power converter 3 from both sides.

(Modification example 5) In the first to fourth embodiments, the battery module 2 and the power converter 3 each pass through a circuit substrate in thermal coupling to the thermal coupling member 5, but there is no limitation thereto. The battery module 2 may be in direct contact with the first surface 5a or the second surface 5b of the thermal coupling member 5. The power converter 3 may be in direct contact with the first surface 5a or the second surface 5b of the thermal coupling member 5.

INDUSTRIAL APPLICABILITY

According to the above power conversion device, it is possible to suppress an increase in the size of the power conversion device.

REFERENCE SIGNS LIST 1, 1B, 1C Power conversion device
2 Battery module
3 Power converter
4 Circuit substrate (first circuit substrate)
5 Thermal coupling member
6 Circuit substrate for control (second circuit substrate)
20 All-solid-state battery
31 Boost converter
32 Inverter
T1, T2 Switching element
T11 to T16 Switching element
200 Electric drive unit
201 Motor

The invention claimed is:

1. A power conversion device comprising:
an all-solid-state battery;
a power converter that converts power between the all-solid-state battery and a load; and
a thermal coupling member that thermally couples the all-solid-state battery and the power converter, the thermal coupling member being configured to transfer heat of the power converter to the all-solid-state battery, the thermal coupling member including a refrigerant flow channel through which a refrigerant circulates, wherein
the all-solid-state battery is located at a downstream side of the refrigerant flow channel, and
the power converter is located at an upstream side of the refrigerant flow channel.

2. The power conversion device according to claim 1, further comprising a first circuit substrate having a first surface and a second surface opposite to the first surface,
wherein the all-solid-state battery and the power converter are mounted on the first surface, and
the thermal coupling member is disposed on the second surface.

3. The power conversion device according to claim 2, wherein the power converter includes an inverter and a step-up converter, and
the inverter, the step-up converter, and the all-solid-state battery are mounted in that order from a first end side of the first surface toward its second end side.

4. The power conversion device according to claim 3, wherein a switching element included in the inverter and the step-up converter is a switching element formed of a wide-gap semiconductor.

5. The power conversion device according to claim 2, further comprising:
a first control device that monitors a state of the all-solid-state battery;
a second control device that controls the power converter; and
a second circuit substrate having a third surface facing the first surface and a fourth surface opposite to the third surface,
wherein the first control device is mounted on at least any of the third surface and the fourth surface so as to be located above the all-solid-state battery, and
the second control device is mounted on at least any of the third surface and the fourth surface so as to be located above the power converter.

6. An electric drive unit comprising:
the power conversion device according to claim 2; and
a motor serving as the load, wherein the motor is thermally coupled to the all-solid-state battery and the power converter by being in contact with the thermal coupling member.

* * * * *